(12) United States Patent
Takada et al.

(10) Patent No.: US 10,498,313 B1
(45) Date of Patent: Dec. 3, 2019

(54) LEVEL SHIFT CIRCUIT

(71) Applicant: ABLIC Inc., Chiba-shi, Chiba (JP)

(72) Inventors: Kosuke Takada, Chiba (JP); Masayuki Uno, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/432,329

(22) Filed: Jun. 5, 2019

(30) Foreign Application Priority Data

Jun. 5, 2018 (JP) ................. 2018-107790

(51) Int. Cl.
*H03L 5/00* (2006.01)
*H03K 3/037* (2006.01)
*H03K 19/0185* (2006.01)

(52) U.S. Cl.
CPC ..... *H03K 3/037* (2013.01); *H03K 19/018521* (2013.01)

(58) Field of Classification Search
CPC ............ H03K 3/037; H03K 19/018521
USPC ...................... 327/333; 326/80, 81
See application file for complete search history.

(56) References Cited

U.S. PATENT DOCUMENTS

| 6,930,518 | B2 * | 8/2005 | Kim | H03K 3/356113 |
|---|---|---|---|---|
| | | | | 326/68 |
| 7,368,970 | B2 * | 5/2008 | Lin | H03K 3/356113 |
| | | | | 327/333 |
| 7,521,982 | B2 * | 4/2009 | Shimizu | H03K 3/0375 |
| | | | | 326/27 |
| 7,956,642 | B2 * | 6/2011 | Lee | H03K 3/356113 |
| | | | | 326/68 |
| 8,456,929 | B2 * | 6/2013 | Liles | H03K 3/356182 |
| | | | | 365/189.11 |
| 8,669,803 | B2 * | 3/2014 | Huang | H03K 3/356165 |
| | | | | 326/68 |
| 9,859,894 | B1 * | 1/2018 | Chou | H03K 19/018528 |
| 9,948,302 | B2 * | 4/2018 | Takada | H03K 17/162 |
| 2005/0134355 | A1 * | 6/2005 | Maede | H03K 3/356113 |
| | | | | 327/333 |
| 2006/0208759 | A1 * | 9/2006 | Nojiri | H03K 3/012 |
| | | | | 326/81 |
| 2010/0123506 | A1 * | 5/2010 | Vu | H03F 3/45183 |
| | | | | 327/333 |
| 2015/0295561 | A1 * | 10/2015 | Malkov | H03K 19/018507 |
| | | | | 327/333 |
| 2015/0381180 | A1 * | 12/2015 | Tsuji | H03K 19/018521 |
| | | | | 327/319 |

FOREIGN PATENT DOCUMENTS

JP        H 11-205123 A        7/1999

* cited by examiner

*Primary Examiner* — Ryan Jager
(74) *Attorney, Agent, or Firm* — Brinks Gilson & Lione

(57) ABSTRACT

A level shift circuit includes two resistors by which logic is fixed when two input terminals become low level, and a logic circuit and transistors which set the logic of an output terminal to a desired value according to the fixation of the logic.

3 Claims, 2 Drawing Sheets

LEVEL SHIFT CIRCUIT

RELATED APPLICATIONS

Priority is claimed on Japanese Patent Application No. 2018-107790, filed on Jun. 5, 2018, the content of which is incorporated herein by reference.

BACKGROUND OF THE INVENTION

1. Field of the Invention

The present invention relates to a level shift circuit.

2. Description of the Related Art

FIG. 2 illustrates a conventional circuit diagram of a level shift circuit 200 in related art.

The conventional level shift circuit 200 includes a power supply terminal 201, a ground terminal 202, a constant voltage circuit 211, input terminals 223 and 224, NMOS transistors 212 and 213, PMOS transistors 214, 215, 217, 218, and 220, and an output terminal 222.

The constant voltage circuit 211 has one end connected to the power supply terminal 201 and the other end connected to a gate of the PMOS transistor 214 and a gate of the PMOS transistor 215. The NMOS transistor 212 has a gate connected to the input terminal 223, a source connected to the ground terminal 202, and a drain connected to a drain of the PMOS transistor 214. The NMOS transistor 213 has a gate connected to the input terminal 224, a source connected to the ground terminal 202, and a drain connected to a drain of the PMOS transistor 215. The PMOS transistor 217 has a source connected to the power supply terminal 201 and a drain connected to a source of the PMOS transistor 214 and a gate of the PMOS transistor 218. The PMOS transistor 218 has a source connected to the power supply terminal 201 and a drain connected to a source of the PMOS transistor 215, a gate of the PMOS transistor 217, and a gate of the PMOS transistor 220. The PMOS transistor 220 has a source connected to the power supply terminal 201 and a drain connected to the output terminal 222. In general, an NMOS transistor 226 which pulls down the output terminal 222 at turning-off of the PMOS transistor 220 is connected to the output terminal 222.

Assuming that a voltage across the constant voltage circuit 211 is VREF, a voltage VBIAS at the other end of the constant voltage circuit 211 becomes a value obtained by subtracting the voltage VREF from the voltage VDD at the power supply terminal 201. Since the voltage VBIAS is supplied to the gates of the PMOS transistors 214 and 215, their source voltages VP1 and VP2 are respectively clamped so as not to become lower than a voltage obtained by adding the threshold voltage |VTHP| of each PMOS transistor to the voltage VBIAS.

This clamping is necessary because the gate-source breakdown voltages of all transistors are lower than the voltage VDD. For example, these voltages can be selected as 12V for the voltage VDD, 6V for the gate-source breakdown voltage, 4V for the voltage VREF, and 1V for the voltage |VTHP|.

An input of high level (e.g., 5V) to the input terminal 223 and an input of low level (e.g., 0V) to the input terminal 224 turns on the NMOS transistor 212 and turns off the NMOS transistor 213. The voltage VP1 is clamped by the PMOS transistor 214 to become VDD−VREF+|VTHP|. At this time, since the PMOS transistor 218 is turned on, the voltage VP2 becomes the voltage VDD and hence the PMOS transistors 217 and 220 turn off. The voltage VOUT at the output terminal 222 becomes 0V by turning on of the NMOS transistor 226.

An input of low level to the input terminal 223 and an input of high level to the input terminal 224 turn on the NMOS transistor and turn off the NMOS transistor 212. The voltage VP2 is clamped by the PMOS transistor 215 to become VDD−VREF+|VTHP|. At this time, since the PMOS transistors 217 and 220 are turned on, the voltage VP1 becomes the voltage VDD and hence the PMOS transistor 218 turns off. Since at this time, the NMOS transistor 226 is turned off, the voltage VOUT at the output terminal 222 becomes the voltage VDD.

As described above, according to the conventional level shift circuit 200, the PMOS transistor 220 is switched according to the signals of the input terminals 223 and 224 to obtain the voltage VDD or 0V from the output terminal 222 as the result of level shifting (refer to, for example, Japanese Patent Application Laid-Open No. H11 (1999)-205123).

SUMMARY OF THE INVENTION

In the conventional level shift circuit 200 such as described above, when the voltage VN1 of the input terminal 223 and the voltage VN2 of the input terminal 224 are both at low level, the voltage VP1 and the voltage VP2 become indefinite, and the voltage VOUT becomes indefinite because the NMOS transistor 226 is also turned off.

Further, in case a PMOS transistor 227 receiving the voltage VOUT at its gate is connected to the output terminal 222, by a rapid rise in the voltage VDD during the indefinite state of the voltage VOUT, a potential difference occurs between the voltage VDD and the voltage VOUT due to a parasitic capacitance between the drain and source of the NMOS transistor 226, thus turning on the PMOS transistor 227.

In the level shift circuit, it is not preferable that the output logic becomes indefinite. Even when the output logic becomes indefinite, a transistor receiving its signal is preferably turned off.

The present invention provides a level shift circuit which fixes the output terminal 222 to the voltage VDD at low impedance so that the voltage VOUT does not become indefinite even when the voltage VN1 and the voltage VN2 are at low level.

A level shift circuit according to an embodiment of the present invention includes: a first transistor having a source connected to a first power supply terminal; a second transistor having a source connected to the first power supply terminal, a gate connected to a drain of the first transistor, and a drain connected to a gate of the first transistor; a first resistive element connected between the first power supply terminal and the drain of the first transistor; a second resistive element connected between the first power supply terminal and the drain of the second transistor; a third transistor having a source connected to a second power supply terminal, a gate connected to a first input terminal, and a drain connected to the drain of the first transistor; a fourth transistor having a source connected to the second power supply terminal, a gate connected to a second input terminal, and a drain connected to the drain of the second transistor; a fifth transistor having a source connected to the first power supply terminal, a gate connected to the drain of the second transistor, and a drain connected to an output terminal of the level shift circuit; a logic circuit having a first input terminal connected to the drain of the first transistor, and a second input terminal connected to the drain of the second transistor; and a sixth transistor having a source connected to the first power supply terminal, a gate connected to an output terminal of the logic circuit, and a drain connected to the output terminal of the level shift circuit.

According to a level shift circuit of the present invention, it is possible to output a desired output logic without having an indefinite output voltage since the level shift circuit includes two resistors which fix the logic when the two input terminals become low level, and a logic circuit and transistors which set the logic of the output terminal to a desired value according to the fixation of the logic.

DETAILED DESCRIPTION OF THE PREFERRED EMBODIMENTS

Embodiments of the present inventions will hereinafter be described with reference to the accompanying drawings.

Figure 1:
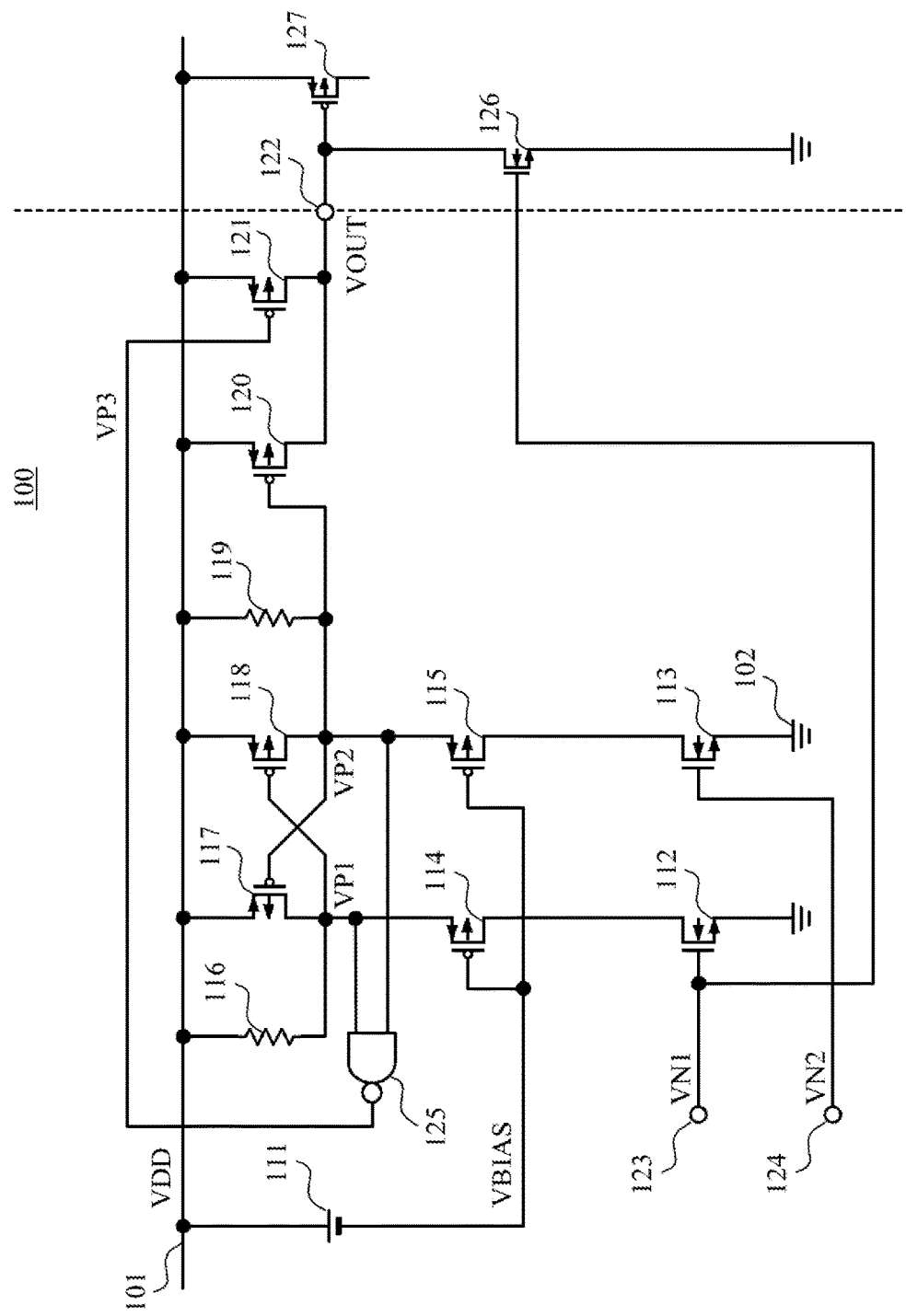
FIG. 1 is a circuit diagram illustrating a level shift circuit according to an embodiment of the present invention.
Figure 2:
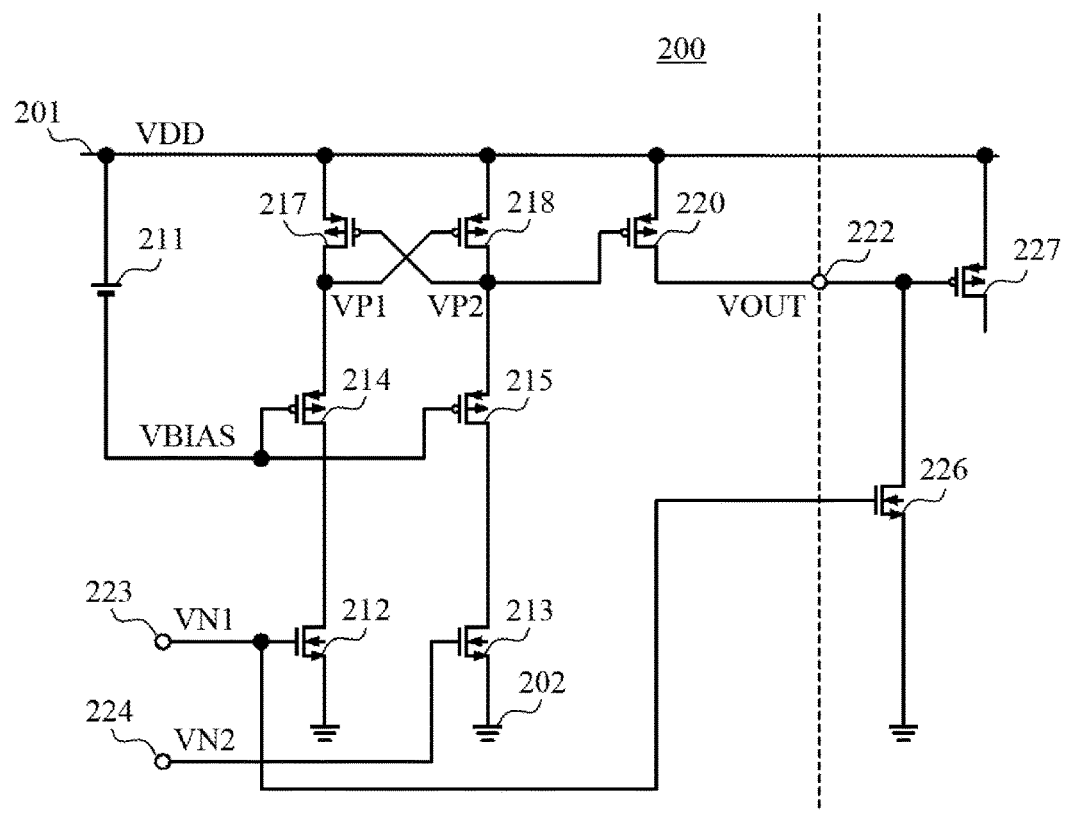
FIG. 2 is a circuit diagram of a conventional level shift circuit in related art.

FIG. 1 is a circuit diagram of a level shift circuit 100 according to an embodiment of the present invention.

The level shift circuit 100 includes a power supply terminal 101, a ground terminal 102, a constant voltage circuit 111, input terminals 123 and 124, NMOS transistors 112 and 113, PMOS transistors 114, 115, 117, 118, 120, and 121, an output terminal 122, resistors 116 and 119, and a NAND circuit 125.

The constant voltage circuit 111 has one end connected to the power supply terminal 101 and the other end connected to a gate of the PMOS transistor 114 and a gate of the PMOS transistor 115. The NMOS transistor 112 has a gate connected to the input terminal 123, a source connected to the ground terminal 102, and a drain connected to a drain of the PMOS transistor 114. The NMOS transistor 113 has a gate connected to the input terminal 124, a source connected to the ground terminal 102, and a drain connected to a drain of the PMOS transistor 115. The PMOS transistor 117 has a source connected to the power supply terminal 101 and a drain connected to a source of the PMOS transistor 114, a gate of the PMOS transistor 118, the other end of the resistor 116, and a first input terminal of the NAND circuit 125. The PMOS transistor 118 has a source connected to the power supply terminal 101 and a drain connected to a source of the PMOS transistor 115, a gate of the PMOS transistor 117, a gate of the PMOS transistor 120, the other end of the resistor 119, and a second input terminal of the NAND circuit 125. The PMOS transistor 120 has a source connected to the power supply terminal 101 and a drain connected to the output terminal 122. The resistor 116 has one end connected to the power supply terminal 101. The resistor 119 has one end connected to the power supply terminal 101. The PMOS transistor 121 has a source connected to the power supply terminal 101 and a drain connected to the output terminal 122. The NAND circuit 125 has an output connected to a gate of the PMOS transistor 121. An NMOS transistor 126 which pulls down the output terminal 122 is connected to the output terminal 122.

Assuming that a voltage across the constant voltage circuit 111 is a voltage VREF, and a voltage applied to the power supply terminal 101 is a voltage VDD, a voltage VBIAS at the other end of the constant voltage circuit 111 becomes a value obtained by subtracting the voltage VREF from the voltage VDD. Since the voltage VBIAS is supplied to the gates of the PMOS transistors 114 and 115, their source voltages VP1 and VP2 are respectively clamped so as not to become lower than a voltage obtained by adding the threshold voltage |VHTP| of each PMOS transistor to the voltage VBIAS. This clamping is necessary because the gate-source breakdown voltages of all transistors are lower than the voltage VDD. For example, the voltages can be selected as 12V for the voltage VDD, 6V for the gate-source breakdown voltage, 4V for the voltage VREF, and 1V for the voltage |VTHP|.

A description will next be made as to the operation of the level shift circuit 100 according to the present embodiment.

As the first state, an input of high level (e.g., 5V) to the input terminal 123 and an input of low level (e.g., 0V) to the input terminal 124 turns on the NMOS transistor 112, and turns off the NMOS transistor 113. The voltage VP1 is clamped by the PMOS transistor 114 to become VDD−VREF+|VTHP|. At this time, since the PMOS transistor 118 is turned on, the voltage VP2 becomes the voltage VDD and hence the PMOS transistors 117 and 120 turn off. The NAND circuit 125 operates on the voltage VBIAS as a reference potential to provide the voltage VDD from the input voltages VP1 and VP2 applied thereto. The PMOS transistor 121 therefore turns off. A voltage VOUT at the output terminal 122 becomes 0V by turning on of the NMOS transistor 126.

As a second state, an input of low level to the input terminal 123 and an input of high level to the input terminal 124 turn on the NMOS transistor 113, and turn off the NMOS transistor 112. The voltage VP2 is clamped by the PMOS transistor 115 to become VDD−VREF+|VTHP|. At this time, since the PMOS transistors 117 and 120 are turned on, the voltage VP1 becomes the voltage VDD and hence the PMOS transistor 118 turns off. The NAND circuit 125 provides the voltage VDD from the input voltages VP1 and VP2. The PMOS transistor 121 therefore turns off. The voltage VOUT at the output terminal 122 becomes the voltage VDD by turning off of the NMOS transistor 126.

As a third state, an input of low level to the input terminal 123 and to the input terminal 124 turn off the NMOS transistors 113 and 112. The voltages VP2 and VP1 become the voltage VDD by the resistors 116 and 119, and hence the PMOS transistors 117, 118, and 120 turn off. The NAND circuit 125 outputs the voltage VBIAS from the input voltages VP1 and VP2. The PMOS transistor 121 therefore turns on. Since the NMOS transistor 126 is turned off, the voltage VOUT at the output terminal 122 becomes the voltage VDD by the PMOS transistor 121.

As described above, since the level shift circuit 100 according to the present embodiment includes the resistors 116 and 119, the NAND circuit 125, and the PMOS transistor 121, the output terminal 122 does not become indefinite and the voltage VOUT can be made equal to the voltage VDD even when low level is applied to the input terminals 123 and 124. Unintentional turning on of the PMOS transistor 127 is therefore prevented even though the PMOS transistor 127 is connected to the output terminal 122.

Although the embodiment of the present invention has been described above, the present invention is not limited to the above embodiment. It is needless to say that various changes can be made thereto within the scope not departing from the gist of the present invention.

For example, in the above embodiment, the NAND circuit 125 may be replaced with an AND circuit, and the PMOS transistor 121 may be replaced with an NMOS transistor. Also, for example, it is enough for the resistors 116 and 119 to include a pulling-up function. A depletion transistor or a JFET may be used therefor. Further, for example, in the above embodiment, it is also possible to use a circuit configuration in which the polarities of the PMOS and NMOS transistors are inverted. Furthermore, for example, although there has been described the example in which the MOS transistors are used as for the level shift circuit, bipolar transistors and the like may be used.

What is claimed is:

1. A level shift circuit comprising:
    a first transistor having a source connected to a first power supply terminal;
    a second transistor having a source connected to the first power supply terminal, a gate connected to a drain of the first transistor, and a drain connected to a gate of the first transistor;
    a first resistive element connected between the first power supply terminal and the drain of the first transistor;
    a second resistive element connected between the first power supply terminal and the drain of the second transistor;
    a third transistor having a source connected to a second power supply terminal, a gate connected to a first input terminal, and a drain connected to the drain of the first transistor;
    a fourth transistor having a source connected to the second power supply terminal, a gate connected to a second input terminal, and a drain connected to the drain of the second transistor;
    a fifth transistor having a source connected to the first power supply terminal, a gate connected to the drain of the second transistor, and a drain connected to an output terminal of the level shift circuit;
    a logic circuit having a first input terminal connected to the drain of the first transistor, and a second input terminal connected to the drain of the second transistor; and
    a sixth transistor having a source connected to the first power supply terminal, a gate connected to an output terminal of the logic circuit, and a drain connected to the output terminal of the level shift circuit.

2. The level shift circuit according to claim 1, wherein the logic circuit turns on the sixth transistor when voltages of the first and second input terminals are equal to a voltage of the first power supply terminal.

3. The level shift circuit according to claim 1, further comprising:
    a constant voltage circuit having one end connected to the first power supply terminal;
    a seventh transistor having a gate connected to the other end of the constant voltage circuit and connected between the drain of the first transistor and the drain of the third transistor; and
    an eighth transistor having a gate connected to the other end of the constant voltage circuit and connected between the drain of the second transistor and the drain of the fourth transistor.

* * * * *